United States Patent
Chung et al.

(10) Patent No.: US 7,636,250 B2
(45) Date of Patent: Dec. 22, 2009

(54) RANDOM ACCESS MEMORY THAT SELECTIVELY PROVIDES DATA TO AMPLIFIERS

(75) Inventors: Jiyoon Chung, South Burlington, VT (US); Oliver Kiehl, Charlotte, VT (US)

(73) Assignee: Qimonda North America Corp., Cary, NC (US)

( * ) Notice: Subject to any disclaimer, the term of this patent is extended or adjusted under 35 U.S.C. 154(b) by 199 days.

(21) Appl. No.: 11/487,875

(22) Filed: Jul. 17, 2006

(65) Prior Publication Data

US 2008/0013391 A1 Jan. 17, 2008

(51) Int. Cl.
*G11C 5/06* (2006.01)
(52) U.S. Cl. ........................................ 365/63
(58) Field of Classification Search ............ 365/230.03, 365/63, 206
See application file for complete search history.

(56) References Cited

U.S. PATENT DOCUMENTS

| 5,748,547 | A | 5/1998 | Shau |
| 6,198,682 | B1 | 3/2001 | Proebsting |
| 6,240,043 | B1 | 5/2001 | Hanson et al. |
| 6,381,180 | B1 | 4/2002 | Merritt et al. |
| 6,735,138 | B2 | 5/2004 | Schroder et al. |
| 6,788,600 | B2 * | 9/2004 | Sugawara et al. ............ 365/207 |
| 2002/0012282 | A1 * | 1/2002 | Saito et al. ................... 365/200 |

* cited by examiner

*Primary Examiner*—Son Dinh
(74) *Attorney, Agent, or Firm*—Dicke, Billig & Czaja, P.L.L.C.

(57) ABSTRACT

A random access memory including a first amplifier, a second amplifier, a first data path, a second data path, and a first circuit. The first data path receives first data via first memory cells and the second data path receives second data via second memory cells. The first circuit is configured to receive the first data via the first data path and the second data via the second data path. The first circuit is configured to selectively provide the first data to the first amplifier and the second amplifier and the second data to the first amplifier and the second amplifier.

21 Claims, 7 Drawing Sheets

RANDOM ACCESS MEMORY THAT SELECTIVELY PROVIDES DATA TO AMPLIFIERS

BACKGROUND

Typically, an electrical system includes a number of circuits that communicate with one another to perform system applications. Often, the electrical system includes one or more controllers, such as a micro-processor, and one or more memory devices, such as a random access memory (RAM) device. The controller communicates with the memory to store data and to read the stored data.

The RAM can be any suitable type of RAM, such as single data rate synchronous dynamic RAM (SDR-SDRAM), double data rate SDRAM (DDR-SDRAM), and graphics double data rate synchronous graphics RAM (GDDR-SGRAM). Also, the RAM can be any suitable generation of memory, including double data rate two SDRAM (DDR2-SDRAM) and higher generations of RAM. Usually, each new generation of RAM is faster and includes different features.

Customers choose the RAM they need based on characteristics such as data rate, memory size, and data burst length. The data burst length is the amount of data transferred during memory read and write operations. Some systems use memory architectures that need shorter burst lengths, while others need longer burst lengths.

Fluctuating customer demands make it difficult to predict which data rates, memory sizes, and data burst lengths will result in the largest profit to the manufacturer. Manufacturers provide an ever increasing variety of RAMs to the marketplace. RAMs are supplied in different data rates, memory sizes, and data burst lengths to fit the ever increasing number and variety of system applications, such as mobile applications, graphics applications, personal computer applications, and server applications.

While some RAM suppliers have the resources to design many different RAM chips and offer the customer a wide variety of devices, other suppliers have a more limited amount of resources for creating a product portfolio and maximizing profits. A RAM device that includes multiple data burst length capabilities can fill the needs of a variety of customers and benefit customers via greater system design flexibility and economies of scale that result in lower costs.

For these and other reasons there is a need for the present invention.

SUMMARY

One aspect of the present invention provides a random access memory including a first amplifier, a second amplifier, a first data path, a second data path, and a first circuit. The first data path receives first data via first memory cells and the second data path receives second data via second memory cells. The first circuit is configured to receive the first data via the first data path and the second data via the second data path. The first circuit is configured to selectively provide the first data to the first amplifier and the second amplifier and the second data to the first amplifier and the second amplifier.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
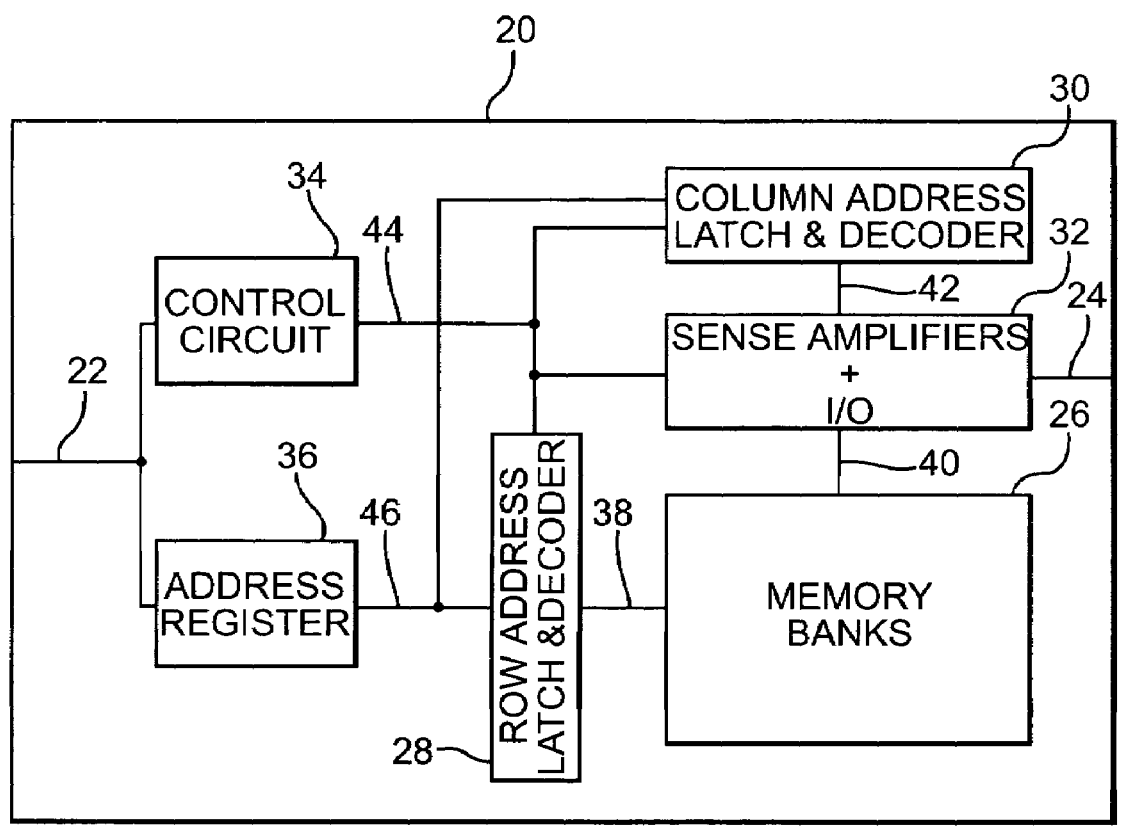
FIG. 1 is a block diagram illustrating one embodiment of a RAM according to the present invention.

FIG. 1 is a block diagram illustrating one embodiment of a RAM 20 according to the present invention. RAM 20 can be electrically coupled to external circuitry via memory communications path 22 and input/output (I/O) communications path 24. RAM 20 receives control signals and row and column address signals via memory communications path 22. RAM 20 receives write data and provides read data via I/O communications path 24. RAM 20 can be any suitable type of RAM. In one embodiment, RAM 20 is an SDR-SDRAM. In one embodiment, RAM 20 is a DDR-SDRAM. In one embodiment, RAM 20 is a GDDR-SGRAM. In any embodiment, RAM 20 can be any suitable generation of RAM.

RAM 20 is configured to output data in at least two different data burst length settings. RAM 20 prefetches N data signals and either outputs N prefetched data bits in a data burst of N data bits or outputs a subset, i.e., less than N, of the N prefetched data bits in a data burst of less than N data bits. To enhance column to column delay times and data rate, RAM 20 includes a circuit that can switch a subset of the N prefetched data signals to either one of two data I/O paths. The subset of the N prefetched data signals is switched to whichever data path is not busy, i.e., free to receive data. Thus, if the subset is one half or less of the N prefetched data signals, sequential subsets can be alternated between the two data paths to enhance output data rates. In one embodiment, RAM 20 prefetches N data signals and outputs N/2 of the N prefetched data signals in a data burst. In other embodiments, RAM 20 prefetches N data signals and outputs any suitable number of the N prefetched data signals in a data burst.

RAM 20 includes memory banks 26, a row address latch and decoder 28, a column address latch and decoder 30, sense amplifier and I/O circuit 32, a control circuit 34, and an address register 36. Row address latch and decoder 28 is electrically coupled to the memory banks 26 via word lines 38, referred to as row select lines. Sense amplifier and I/O circuit 32 is electrically coupled to the memory banks 26 via bit lines 40. In one embodiment, RAM 20 includes four memory banks. In one embodiment, RAM 20 includes eight memory banks. In other embodiments, RAM 20 includes any suitable number of memory banks.

Each of the bit lines 40 is electrically coupled to a primary sense amplifier in sense amplifier and I/O circuit 32. Sense amplifier and I/O circuit 32 is electrically coupled to column address latch and decoder 30 via column select lines 42 and to data I/O pads, referred to as DQ pads, via I/O communications path 24. Data is transferred between sense amplifier and I/O circuit 32 and an external device via I/O communications path 24.

Control circuit 34 and address register 36 can be electrically coupled to an external device via memory communications path 22. Control circuit 34 is electrically coupled to row address latch and decoder 28, column address latch and decoder 30, and sense amplifier and I/O circuit 32 via control communications path 44. Address register 36 is electrically coupled to row address latch and decoder 28 and column address latch and decoder 30 via row and column address lines 46.

Address register 36 receives row and column addresses via memory communications path 22 and supplies a row address to row address latch and decoder 28 via row and column address lines 46. Control circuit 34 supplies a RAS signal to row address latch and decoder 28 via control communications path 44 to latch the supplied row address into row address latch and decoder 28. Address register 36 supplies a column address to column address latch and decoder 30 via row and column address lines 46 and control circuit 34 supplies a CAS signal to column address latch and decoder 30 via control communications path 44 to latch the supplied column address into column address latch and decoder 30.

Sense amplifier and I/O circuit 32 includes sense amplifiers and I/O data paths for reading data from and writing data into the memory banks 26. To read a single data bit, a primary sense amplifier in sense amplifier and I/O circuit 32 receives the data bit value and amplifies the difference between the data bit value and a reference value. The sensed output value is output to one or more external devices via I/O communications path 24 and a DQ pad. To write a single data bit, a DQ pad receives the data bit from an external device and transfers the data bit to a primary sense amplifier in sense amplifier and I/O circuit 32 via I/O communications path 24. Input drivers overdrive the primary sense amplifier to overdrive the data bit value onto the bit line, which is connected to a selected memory cell. The primary sense amplifier writes the received data bit value into the selected memory cell. In one embodiment, sense amplifier and I/O circuit 32 is configured to receive a data burst of write data bits and to write the received data burst into the memory banks 26.

In a read operation, sense amplifier and I/O circuit 32 is configured to prefetch multiple data bits in parallel from the memory banks 26 and output at least some of the prefetched data bits in a data burst via I/O communications path 24 and one of the DQ pads. Sense amplifier and I/O circuit 32 is configured to output data in at least two data burst lengths, wherein sense amplifier and I/O circuit 32 prefetches N data signals and outputs either N prefetched data bits in a data burst of N data bits or outputs a subset of the N prefetched data bits in a data burst of less than N data bits. Also, sense amplifier and I/O circuit 32 can switch prefetched data signals to either one of two data I/O paths, whichever data path is not busy. Thus, if a subset is one half or less of the N prefetched data signals, sequential subsets can be alternated between the two data paths to enhance output data rates. In one embodiment, sense amplifier and I/O circuit 32 prefetches N data signals and outputs N/2 of the N prefetched data signals in a data burst. In other embodiments, sense amplifier and I/O circuit 32 prefetches N data signals and outputs any suitable number of the N prefetched data signals in a data burst.

Row address latch and decoder 28 receives the row addresses and RAS signals and latches the row addresses into row address latch and decoder 28. Also, row address latch and decoder 28 decodes each of the row addresses to select a row of memory cells in the memory banks 26. In addition, row address latch and decoder 28 provides sensing, equalization, and precharge signals to sense amplifier and I/O circuit 32 via control communications path 44. Sense amplifier and I/O circuit 32 equalizes and precharges bit lines 40 prior to read and write operations based on the received equalization and precharge signals.

Column address latch and decoder 30 activates column select lines 42 to activate or access data of selected column addresses from primary sense amplifiers in sense amplifier and I/O circuit 32. In a prefetch of N data signals, column address latch and decoder 30 activates one of the column select lines 42 to activate or access data from N primary sense amplifiers. Column address latch and decoder 30 receives a column address and latches the column address into column address latch and decoder 30. Also, column address latch and decoder 30 decodes the column address to select addressed column select lines 42. In addition, column address latch and decoder 30 receives column select line activation signals from control circuit 34 via control communications path 44. The column select line activation signals indicate which of the addressed column select lines 42 are to be activated by column address latch and decoder 30. Column address latch and decoder 30 activates column select lines 42 that are addressed by the column address and selected for activation by the column select line activation signals.

Control circuit 34 receives addresses and control signals via memory communications path 22 and provides control signals to row address latch and decoder 28, column address latch and decoder 30, and sense amplifier and I/O circuit 32 via control communications path 44. Control circuit 34 provides control signals to sense amplifier and I/O circuit 32 to output N or a subset of the N prefetched data bits in a data burst. Also, control circuit 34 provides control signals to sense amplifier and I/O circuit 32 to switch prefetched data signals between data I/O paths.

During a write operation, write data is supplied from an external device to DQ pads, which supply the write data to sense amplifier and I/O circuit 32 via I/O communications path 24. Control circuit 34 receives write control signals and address register 36 receives the row address of selected memory cells in memory banks 26. The row address is supplied from address register 36 to row address latch and decoder 28 and latched into row address latch and decoder 28 via control circuit 34 and a RAS signal. The row address latch and decoder 28 decodes the row address and activates the selected word line 38. As the selected word line 38 is activated, the value stored in each memory cell coupled to the selected word line 38 is passed to the respective bit line 40 and to a primary sense amplifier that is electrically coupled to the respective bit line 40.

Next, control circuit 34 and address register 36 receive the column address of the selected memory cells and address register 36 supplies the column address to column address latch and decoder 30. The column address is latched into column address latch and decoder 30 by control circuit 34 and a CAS signal. Column address latch and decoder 30 receives column select line activation signals from control circuit 34 and activates one or more selected column select lines. Input drivers overdrive the activated primary sense amplifiers to write data to the selected memory cells.

During a read operation, control circuit 34 receives read control signals and address register 36 receives the row address of selected memory cells in the memory banks 26. Address register 36 supplies the row address to row address latch and decoder 28, which latches the row address in via control circuit 34 and a RAS signal. Row address latch and decoder 28 decodes the row address and activates the selected word line 38. As the selected word line 38 is activated, the data value stored in each memory cell coupled to the selected word line 38 is passed to the respective bit line 40 and primary sense amplifier.

Next, control circuit 34 and address register 36 receive the column address of the selected memory cells. The column address is supplied from address register 36 to column address latch and decoder 30 and latched into column address latch and decoder 30 via control circuit 34 and a CAS signal. The column address latch and decoder 30 decodes the column address to select addressed column select lines 42. Control circuit 34 provides column select line activation signals to activate selected column select lines 42. Each of the activated column select lines activates N primary sense amplifiers to prefetch N data signals in parallel. The activated sense amplifiers amplify the received data values and provide sensed output values. Control circuit 34 provides control signals to sense amplifier and I/O circuit 32 to switch prefetched data signals between data I/O paths and to output N or a subset of the N prefetched data bits in a data burst via I/O communications path 24.

Figure 2:
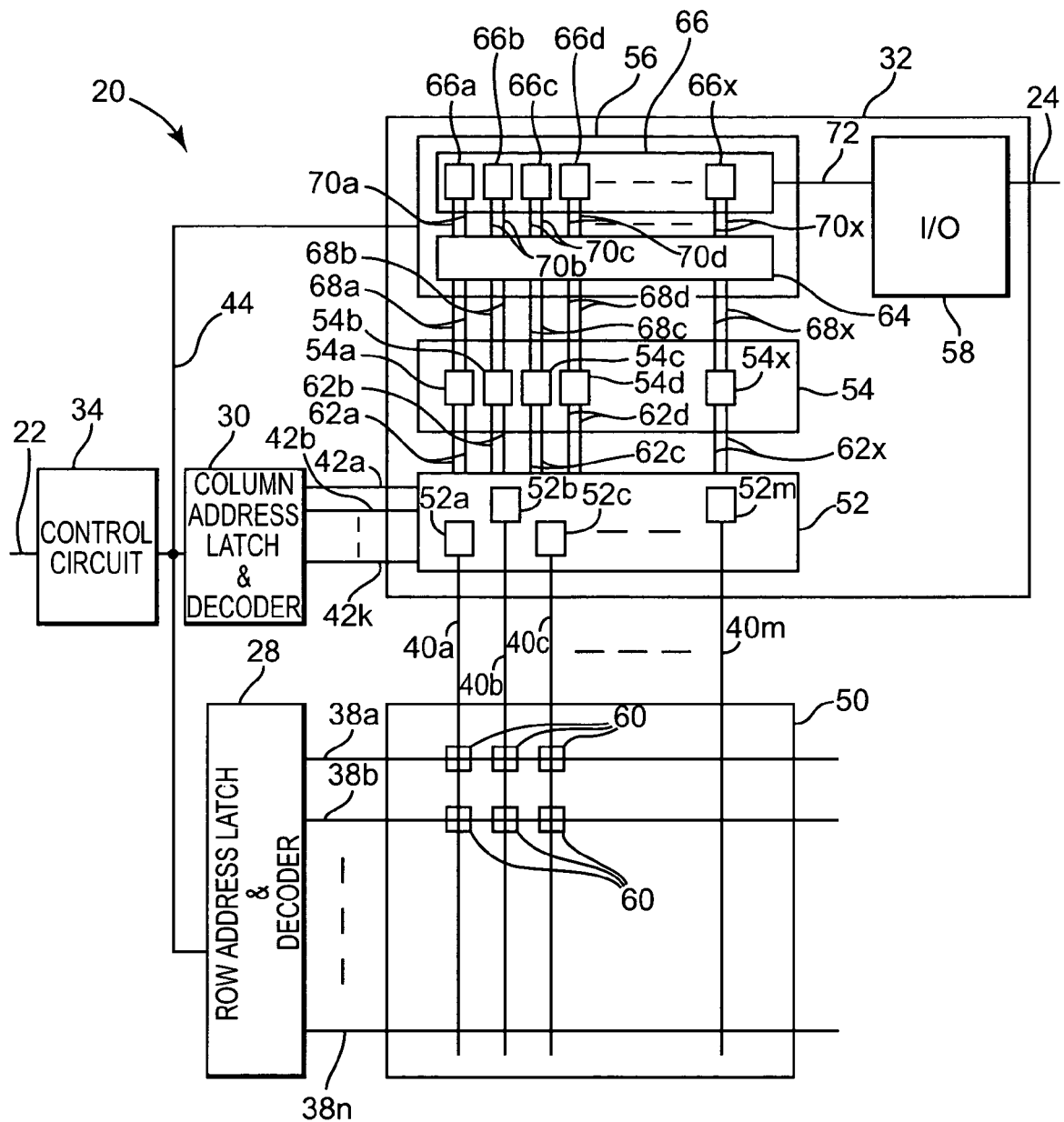
FIG. 2 is a block diagram illustrating one embodiment of a RAM including a sense amplifier and I/O circuit coupled to a memory bank.

FIG. 2 is a block diagram illustrating one embodiment of RAM 20 including sense amplifier and I/O circuit 32 coupled to a memory bank 50. RAM 20 includes row address latch and decoder 28, column address latch and decoder 30, sense amplifier and I/O circuit 32, and control circuit 34, which were described in reference to FIG. 1. Also, RAM 20 includes memory bank 50, which is one of the memory banks 26 described in reference to FIG. 1.

Control circuit 34 receives control signals and address signals via memory communications path 22. Also, control circuit 34 is electrically coupled to and provides control signals and address signals to row address latch and decoder 28, column address latch and decoder 30, and sense amplifier and I/O circuit 32 via control communications path 44.

Sense amplifier and I/O circuit 32 writes data into and reads data from memory bank 50. Sense amplifier and I/O circuit 32 is electrically coupled to DQ pads via I/O communications path 24. Write data and read data are communicated between sense amplifier and I/O circuit 32 and an external device via I/O communications path 24 and the DQ pads. Sense amplifier and I/O circuit 32 includes primary sense amplifiers 52, secondary sense amplifiers 54, a data bus circuit 56, and an I/O circuit 58.

Word lines 38a-38n extend in the x-direction across memory bank 50 and bit lines 40a-40m extend in the y-direction across memory bank 50. A memory cell 60 is located at each cross point of a word line 38a-38n and a bit line 40a-40m. Word lines 38a-38n are electrically coupled to row address latch and decoder 28. Bit lines 40a-40m are electrically coupled to primary sense amplifiers 52a-52m, respectively. Also, column address latch and decoder 30 is electrically coupled to primary sense amplifiers 52a-52m via column select lines 42a-42k.

Each of the column select lines 42a-42k is electrically coupled to N primary sense amplifiers 52a-52m. If one of the column select lines 42a-42k is activated, N primary sense amplifiers 52a-52m are activated to prefetch N data bits from N memory cells 60. Primary sense amplifiers 52a-52m can be electrically coupled to communicate with secondary sense amplifiers 54a-54x via differential pairs of sense amplifier I/O lines 62a-62x. Each of the secondary sense amplifiers 54a-54x is electrically coupled to one of the differential pairs of sense amplifier I/O lines 62a-62x, respectively. Also, each set of N primary sense amplifiers 52a-52m coupled to one of the column select lines 42a-42k can be electrically coupled to N secondary sense amplifiers 54a-54x via N differential pairs of sense amplifier I/O lines 62a-62x. Different sets of N primary sense amplifiers 52a-52m share the same N secondary sense amplifiers 54a-54x.

In one embodiment, the number of primary sense amplifiers 52a-52m is 1024. In one embodiment, the number of primary sense amplifiers 52a-52m activated per column select line 42a-42k and the number of prefetched data bits N is eight. In one embodiment, the number of primary sense amplifiers 52a-52m activated per column select line 42a-42k and the number of prefetched data bits N is four. In one embodiment, the number of primary sense amplifiers 52a-52m activated per column select line 42a-42k and the number of prefetched data bits N is two. In other embodiments, the number of primary sense amplifiers 52a-52m activated per column select line 42a-42k N can be any suitable value.

Data bus circuit 56 includes switching circuit 64 and data bus amplifiers 66. Secondary sense amplifiers 54a-54x are electrically coupled to differential pairs of local I/O lines 68a-68x, respectively, which are electrically coupled to switching circuit 64. Switching circuit 64 is electrically coupled to data bus amplifiers 66a-66x via differential pairs of switching I/O lines 70a-70x, respectively. Each set of N secondary sense amplifiers 54a-54x is electrically coupled to a set of N differential pairs of local I/O lines 68a-68x, respectively, and switching circuit 64.

Switching circuit 64 is configured to selectably couple local I/O lines 68a-68x to data bus amplifiers 66a-66x. Switching circuit 64 receives a gate signal to selectably switch one or more local I/O lines 68a-68x from one or more of the data bus amplifiers 66a-66x to another one or more of the data bus amplifiers 66a-66x. Each of the data bus amplifiers 66a-66x is electrically coupled to I/O circuit 58 via a corresponding one of the data bus I/O lines 72. I/O circuit 58 receives data bits and multiplexes the received signals to provide the data bits to first-in-first-out (FIFO) circuitry and output the data bits in data bursts via I/O communications path 24 and the DQ pads.

In one embodiment, each set of N secondary sense amplifiers 54a-54x and N differential pairs of local I/O lines 68a-68x are coupled to N data bus amplifiers 66a-66x that are electrically coupled to N data bus I/O lines 72. The N data bus I/O lines 72 provide up to N data bits to I/O circuit 58, which outputs up to N data bits in a data burst at one DQ line.

Control circuit 34 is electrically coupled to data bus circuit 56 to control data burst length and provide the gate signal to switch data signals onto data bus I/O lines 72. If the data burst length is N, control circuit 34 activates or enables N data bus amplifiers 66a-66x to output N data signals on N data I/O lines 72 per DQ pad. If the data burst length is a subset of N data signals, control circuit 34 activates a corresponding subset of data bus amplifiers 66a-66x to output the subset of N data signals on a subset of the N data I/O lines per DQ.

During a read operation, control circuit 34 receives read control signals and address register 36 (not shown) receives the row address of selected memory cells 60 in memory bank 50. Address register 36 supplies the row address to row address latch and decoder 28, which latches the row address in via control circuit 34 and a RAS signal. Row address latch and decoder 28 decodes the row address and activates a selected one of the word lines 38a-38n. As the selected one of the word lines 38a-38n is activated, the data value stored in each memory cell 60 coupled to the selected one of the word lines 38a-38n is passed to the respective one of the bit lines 40a-40m and primary sense amplifiers 52a-52m.

Next, control circuit 34 and address register 36 receive the column address of the selected memory cells 60. The column address is supplied from address register 36 to column address latch and decoder 30 and latched into column address latch and decoder 30 via control circuit 34 and a CAS signal. The column address latch and decoder 30 decodes the column address to select addressed column select lines 42a-42k. Control circuit 34 provides column select line activation signals to activate one or more of the selected column select lines 42a-42k. Each of the activated column select lines 42a-42k activates N primary sense amplifiers 52a-52m to prefetch N data signals in parallel. The activated sense amplifiers 52a-52m amplify the received data values and provide sensed output values.

Each set of N primary sense amplifiers 52a-52m provides N data signals to N secondary sense amplifiers 54a-54x, which provide the N data signals to switching circuit 64 via N local I/O lines 68a-68x. Control circuit 34 provides control signals to data bus circuit 56 to control data burst length and switch data signals onto data bus I/O lines 72. If the data burst length is N, control circuit 34 activates or enables N data bus amplifiers 66a-66x to output N data signals onto N data I/O lines 72 per DQ pad. Also, control circuit 34 provides a gate signal to pass the N data signals to the enabled N data bus amplifiers 66a-66x. If the data burst length is a subset of N data signals, control circuit 34 activates a corresponding subset of data bus amplifiers 66a-66x to output the subset of N data signals onto a subset of the N data I/O lines per DQ pad. Also, control circuit 34 provides a gate signal to pass the subset of N data signals to the enabled subset of N data bus amplifiers 66a-66x. For each DQ pad, I/O circuit 58 receives either the N data bits or the subset of N data bits and outputs the received data bits in a corresponding data burst at the DQ pad. In one embodiment, the subset of N data signals is N/2 data signals and control circuit 34 alternates between providing the subset of N/2 data bits on one half of the N data I/O lines 72 and the other half of the data I/O lines 72.

In other embodiments, secondary sense amplifiers 54a-54x can be enabled via control circuit 34 to control the data burst length. In other embodiments, switching circuit 64 can be situated between primary sense amplifiers 52a-52m and secondary sense amplifiers 54a-54x to switch received data signals between data I/O lines 72. In other embodiments, secondary sense amplifiers 54a-54x can be enabled via control circuit 34 to control the data burst length and switching circuit 64 can be situated between primary sense amplifiers 52a-52m and secondary sense amplifiers 54a-54x to switch received data signals between data I/O lines 72.

Figure 3:
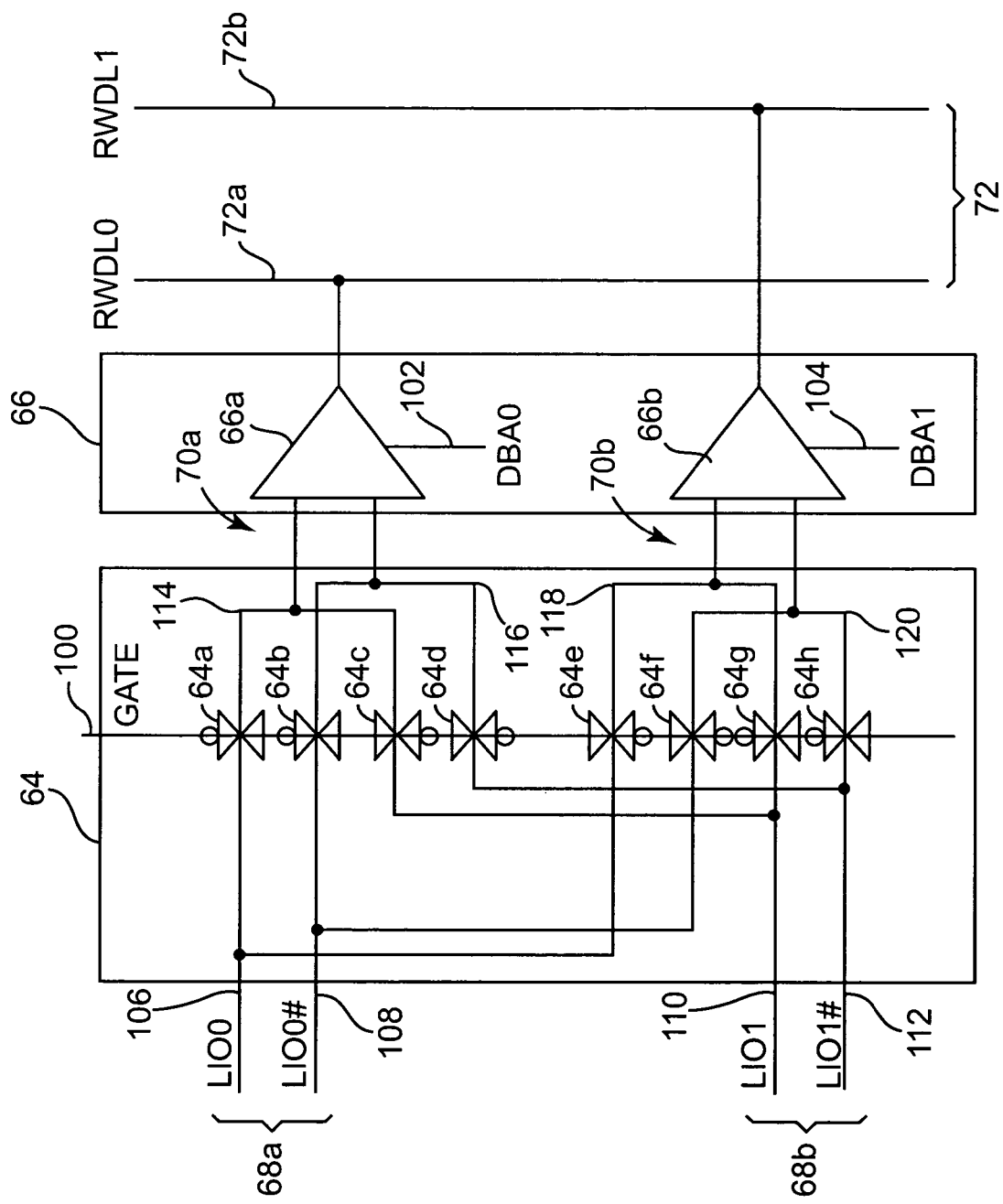
FIG. 3 is a diagram illustrating one embodiment of a switching circuit and data bus amplifiers.

FIG. 3 is a diagram illustrating one embodiment of switching circuit 64 and data bus amplifiers 66. Switching circuit 64 is configured to switch each of two data signals to each of two data bus amplifiers 66. The data bus amplifiers 66 are configured to output the data signals to provide a data burst of two data bits or a data burst of one data bit at a DQ pad. In other embodiments, switching circuit 64 can be configured to switch any suitable number of data signals, such as four, eight, or sixteen data signals. Also, in other embodiments, data bus amplifiers 66 can be configured to output any suitable number of data signals, such as four, eight, or sixteen data signals.

Switching circuit 64 is electrically coupled to secondary sense amplifiers 54 (shown in FIG. 2) via differential pairs of local I/O lines 68a and 68b and to data bus amplifiers 66 via differential pairs of switching I/O lines 70a and 70b. In addition, switching circuit 64 is electrically coupled to control circuit 34 (shown in FIG. 1) via gating signal path 100. Data bus amplifiers 66 are electrically coupled to I/O circuit 58 (shown in FIG. 2) via data I/O lines 72 and to control circuit 34 via data bus amplifier enable lines 102 and 104.

Switching circuit 64 includes pass gates 64a-64h and data bus amplifiers 66 include data bus amplifiers 66a and 66b. Pass gates 64a and 64e are electrically coupled on one side to local I/O line 106 and receive local I/O signal LIO0 at 106. Pass gates 64b and 64f are electrically coupled on one side to local I/O line 108 and receive the inverse local I/O signal LIO0# at 108. Local I/O signals LIO0 and LIO0# are a differential pair of signals that provide a data signal on differential pair of local I/O lines 68a. Pass gates 64c and 64g are electrically coupled on one side to local I/O line 110 and receive local I/O signal LIO1 at 110. Pass gates 64d and 64h are electrically coupled on one side to local I/O line 112 and receive the inverse local I/O signal LIO1# at 112. Local I/O signals LIO1 and LIO1# are a differential pair of signals that provide a data signal on differential pair of local I/O lines 68b.

Pass gates 64a and 64c are electrically coupled to one input of data bus amplifier 66a via input path 114, and pass gates 64b and 64d are electrically coupled to the other input of data bus amplifier 66a via input path 116. Pass gates 64e and 64g are electrically coupled to one input of data bus amplifier 66b via input path 118 and pass gates 64f and 64h are electrically coupled to the other input of data bus amplifier 66b via input path 120.

Data bus amplifiers 66a and 66b are electrically coupled to control circuit 34 via data bus amplifier enable lines 102 and 104. Data bus amplifier 66a receives data bus amplifier enable signal DBA0 at 102 and data bus amplifier 66b receives data bus amplifier enable signal DBA1 at 104. Data bus amplifier 66a is enabled via an active data bus amplifier enable signal DBA0 at 102 and disabled to a tri-state via an inactive data bus amplifier enable signal DBA0 at 102. Data bus amplifier 66b is enabled via an active data bus amplifier enable signal DBA1 at 104 and disabled to a tri-state via an inactive data bus amplifier enable signal DBA1 at 104.

If gating signal GATE at 100 is a low logic level, pass gates 64a and 64b conduct to pass local I/O signals LIO0 and LIO0# to the inputs of data bus amplifier 66a. Also, pass gates 64g and 64h conduct to pass local I/O signals LIO1 and LIO1# to the inputs of data bus amplifier 66b. Pass gates 64c, 64d, 64e and 64f do not conduct, i.e., are high impedance.

Control circuit 34 provides data bus enable signals DBA0 and DBA1 to enable one or both data bus amplifiers 66a and 66b. Control circuit 34 enables one of the data bus amplifiers 66a and 66b to provide a data burst of one and both of the data bus amplifiers 66a and 66b to provide a data burst of two. If data bus amplifier 66a is enabled, differential signals LIO0 and LIO0# are compared to obtain a result that is provided on data bus line 72a as read/write data line signal RWDL0 at 72a.

If data bus amplifier 66b is enabled, differential signals LIO1 and LIO1# are compared to obtain a result that is provided on data bus line 72b as read/write data line signal RWDL1 at 72b.

If gating signal GATE at 100 is a high logic level, pass gates 64c and 64d conduct to pass local I/O signals LIO1 and LIO1# to the inputs of data bus amplifier 66a. Also, pass gates 64e and 64f conduct to pass local I/O signals LIO0 and LIO0# to the inputs of data bus amplifier 66b. Pass gates 64a, 64b, 64g and 64h do not conduct, i.e., are high impedance.

Control circuit 34 provides data bus enable signals DBA0 and DBA1 to enable one or both data bus amplifiers 66a and 66b. Control circuit 34 enables one of the data bus amplifiers 66a and 66b to provide a data burst of one and both of the data bus amplifiers 66a and 66b to provide a data burst of two. If data bus amplifier 66a is enabled, differential signals LIO1 and LIO1# are compared to obtain a result that is provided on data bus line 72a as read/write data line signal RWDL0 at 72a. If data bus amplifier 66b is enabled, differential signals LIO0 and LIO0# are compared to obtain a result that is provided on data bus line 72b as read/write data line signal RWDL1 at 72b.

Figure 4:
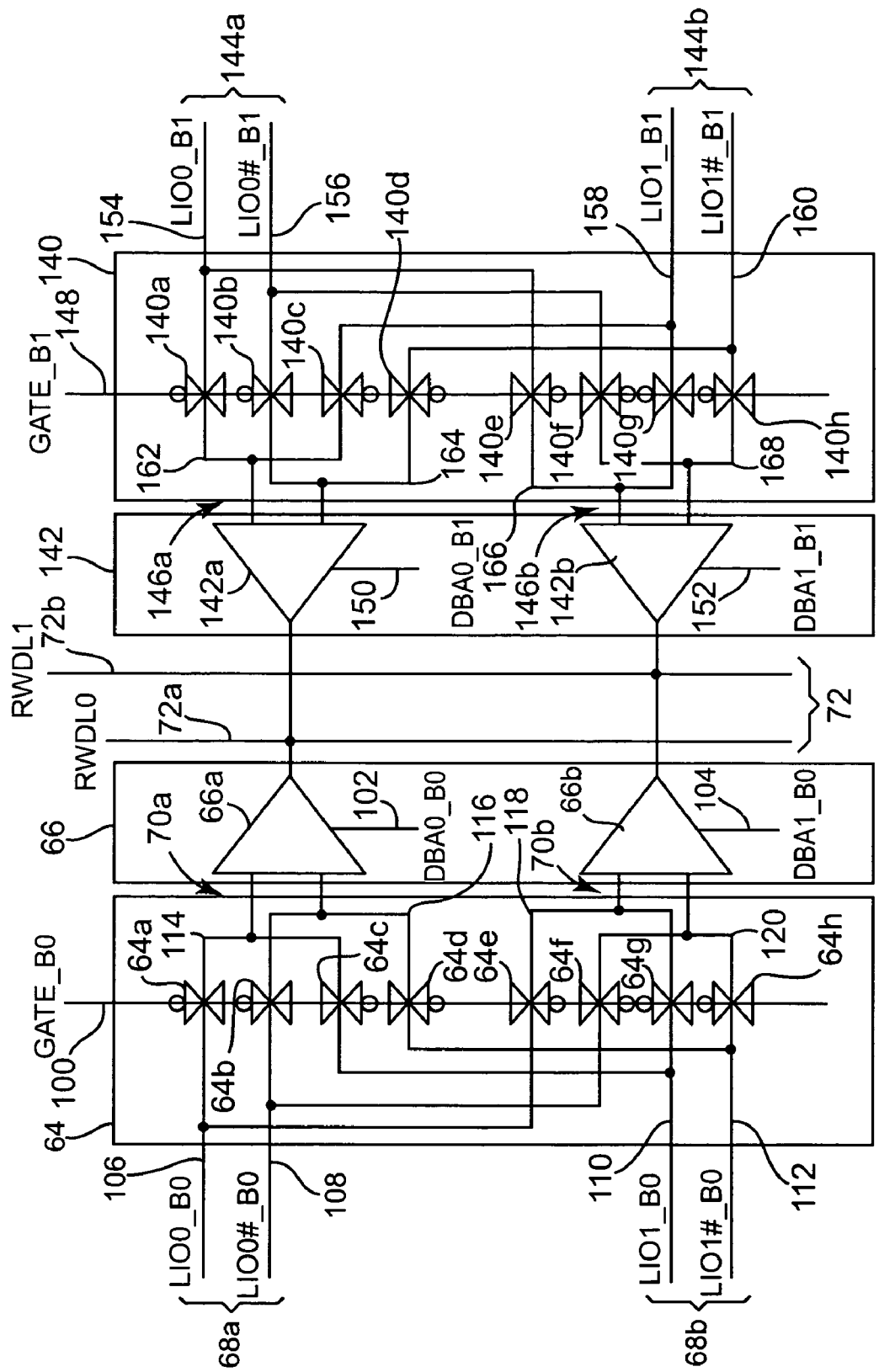
FIG. 4 is a diagram illustrating one embodiment of multiple switching circuits and data bus amplifiers.

FIG. 4 is a diagram illustrating one embodiment of switching circuits 64 and 140 and data bus amplifiers 66 and 142 in RAM 20. Switching circuits 64 and 140 and data bus amplifiers 66 and 142 are coupled to memory bank zero B0 and memory bank one B1 in RAM 20. Data signals are provided from each of the memory banks B0 and B1 via data bus lines 72. In other embodiments, RAM 20 includes any suitable number of switching circuits, data bus amplifiers, and memory banks.

Switching circuit 64 is configured to switch each of two data signals from memory bank zero B0 to each of two data bus amplifiers 66. Switching circuit 140 is configured to switch each of two data signals from memory bank one B1 to each of two data bus amplifiers 142. The data bus amplifiers 66 and 142 are configured to output data signals to provide a data burst of two data bits or a data burst of one data bit at a DQ pad. In other embodiments, switching circuits 64 and 140 can be configured to switch any suitable number of data signals, such as four, eight, or sixteen data signals. Also, in other embodiments, data bus amplifiers 66 and 142 can be configured to output any suitable number of data signals, such as four, eight, or sixteen data signals.

Switching circuit 64 is electrically coupled to secondary sense amplifiers 54 (shown in FIG. 2) via differential pairs of local I/O lines 68a and 68b and to data bus amplifiers 66 via differential pairs of switching I/O lines 70a and 70b. In addition, switching circuit 64 is electrically coupled to control circuit 34 (shown in FIG. 1) via gating signal path 100. Data bus amplifiers 66 are electrically coupled to I/O circuit 58 (shown in FIG. 2) via data I/O lines 72 and to control circuit 34 via data bus amplifier enable lines 102 and 104.

Switching circuit 140 is electrically coupled to secondary sense amplifiers (not shown) via differential pairs of local I/O lines 144a and 144b and to data bus amplifiers 142 via differential pairs of switching I/O lines 146a and 146b. In addition, switching circuit 140 is electrically coupled to control circuit 34 via gating signal path 148. Data bus amplifiers 142 are electrically coupled to I/O circuit 58 via data I/O lines 72 and to control circuit 34 via data bus amplifier enable lines 150 and 152.

Switching circuit 64 includes pass gates 64a-64h and data bus amplifiers 66 includes data bus amplifiers 66a and 66b. Pass gates 64a and 64e are electrically coupled on one side to bank zero, local I/O line 106 and receive bank zero, local I/O signal LIO0_B0 at 106. Pass gates 64b and 64f are electrically coupled on one side to bank zero, local I/O line 108 and receive the inverse local I/O signal from bank zero LIO0#_B0 at 108. Bank zero, local I/O signals LIO0_B0 and LIO0#_B0 are a differential pair of signals that provide a data signal on the differential pair of local I/O lines 68a. Pass gates 64c and 64g are electrically coupled on one side to bank zero, local I/O line 110 and receive bank zero, local I/O signal LIO1_B0 at 110. Pass gates 64d and 64h are electrically coupled on one side to bank zero, local I/O line 112 and receive the inverse local I/O signal from bank zero LIO1#_B0 at 112. Bank zero, local I/O signals LIO1_B0 and LIO1#_B0 are a differential pair of signals that provide a data signal on the differential pair of local I/O lines 68b.

Pass gates 64a and 64c are electrically coupled to one input of data bus amplifier 66a via input path 114, and pass gates 64b and 64d are electrically coupled to the other input of data bus amplifier 66a via input path 116. Pass gates 64e and 64g are electrically coupled to one input of data bus amplifier 66b via input path 118, and pass gates 64f and 64h are electrically coupled to the other input of data bus amplifier 66b via input path 120.

Data bus amplifiers 66a and 66b are electrically coupled to control circuit 34 via data bus amplifier enable lines 102 and 104. Data bus amplifier 66a receives bank zero, data bus amplifier enable signal DBA0_B0 at 102 and data bus amplifier 66b receives bank zero, data bus amplifier enable signal DBA1_B0 at 104. Data bus amplifier 66a is enabled via an active data bus amplifier enable signal DBA0_B0 at 102 and disabled to a tri-state via an inactive data bus amplifier enable signal DBA0_B0 at 102. Data bus amplifier 66b is enabled via an active data bus amplifier enable signal DBA1_B0 at 104 and disabled to a tri-state via an inactive data bus amplifier enable signal DBA1_B0 at 104.

Switching circuit 140 includes pass gates 140a-140h and data bus amplifiers 142 includes data bus amplifiers 142a and 142b. Pass gates 140a and 140e are electrically coupled on one side to bank one, local I/O line 154 and receive bank one, local I/O signal LIO0_B1 at 154. Pass gates 140b and 140f are electrically coupled on one side to bank one, local I/O line 156 and receive the inverse local I/O signal from bank one LIO0#_B1 at 156. Bank one, local I/O signals LIO0_B1 and LIO0#_B1 are a differential pair of signals that provide a data signal on the differential pair of local I/O lines 144a. Pass gates 140c and 140g are electrically coupled on one side to bank one, local I/O line 158 and receive bank one, local I/O signal LIO1_B1 at 158. Pass gates 140d and 140h are electrically coupled on one side to bank one, local I/O line 160 and receive the inverse local I/O signal from bank one LIO1#_B1 at 160. Bank one, local I/O signals LIO1_B1 and LIO1#_B1 are a differential pair of signals that provide a data signal on the differential pair of local I/O lines 144b.

Pass gates 140a and 140c are electrically coupled to one input of data bus amplifier 142a via input path 162, and pass gates 140b and 140d are electrically coupled to the other input of data bus amplifier 142a via input path 164. Pass gates 140e and 140g are electrically coupled to one input of data bus amplifier 142b via input path 166, and pass gates 140f and 140h are electrically coupled to the other input of data bus amplifier 142b via input path 168.

Data bus amplifiers 142a and 142b are electrically coupled to control circuit 34 via data bus amplifier enable lines 150 and 152. Data bus amplifier 142a receives bank one, data bus amplifier enable signal DBA0_B1 at 150 and data bus amplifier 142b receives bank one, data bus amplifier enable signal DBA1_B1 at 152. Data bus amplifier 142a is enabled via an active data bus amplifier enable signal DBA0_B1 at 150 and disabled to a tri-state via an inactive data bus amplifier enable signal DBA0_B1 at 150. Data bus amplifier 142b is enabled via an active data bus amplifier enable signal DBA1_B1 at 152 and disabled to a tri-state via an inactive data bus amplifier enable signal DBA1_B1 at 152.

To read data from RAM 20, a read address is provided to address register 36 (shown in FIG. 1) and control circuit 34. Data is read from the addressed memory banks B0 and B1. Control circuit 34 controls switching circuits 64 and 140 and data bus amplifiers 66 and 142 to provide data from the memory banks B0 and B1 onto data bus lines 72. In one embodiment, only data from one of the memory banks B0 and B1 at a time is provided to the data bus lines 72.

To read data from memory bank zero B0, control circuit 34 provides deactivated bank one, data bus enable signals DBA0_B1 and DBA1_B1, which tri-state data bus amplifiers 142a and 142b. Control circuit 34 can provide a low or high logic signal in gating signal GATE_B1 at 148.

If gating signal GATE_B0 at 100 is a low logic level, pass gates 64a and 64b conduct to pass bank zero, local I/O signals LIO0_B0 and LIO0#_B0 to the inputs of data bus amplifier 66a. Also, pass gates 64g and 64h conduct to pass bank zero, local I/O signals LIO1_B0 and LIO1#_B0 to the inputs of data bus amplifier 66b. Pass gates 64c, 64d, 64e and 64f do not conduct, i.e., are high impedance.

Control circuit 34 provides bank zero, data bus enable signals DBA0_B0 and DBA1_B0 to enable one or both data bus amplifiers 66a and 66b. Control circuit 34 enables one of the data bus amplifiers 66a and 66b to provide a data burst of one and both of the data bus amplifiers 66a and 66b to provide a data burst of two. If data bus amplifier 66a is enabled, bank zero differential signals LIO0_B0 and LIO0#_B0 are compared to obtain a result that is provided on data bus line 72a as read/write data line signal RWDL0 at 72a. If data bus amplifier 66b is enabled, bank zero differential signals LIO1_B0 and LIO1#_B0 are compared to obtain a result that is provided on data bus line 72b as read/write data line signal RWDL1 at 72b.

If gating signal GATE_B0 at 100 is a high logic level, pass gates 64c and 64d conduct to pass bank zero, local I/O signals LIO1_B0 and LIO1#_B0 to the inputs of data bus amplifier 66a. Also, pass gates 64e and 64f conduct to pass bank zero, local I/O signals LIO0_B0 and LIO0#_B0 to the inputs of data bus amplifier 66b. Pass gates 64a, 64b, 64g and 64h do not conduct, i.e., are high impedance.

Control circuit 34 provides bank zero, data bus enable signals DBA0_B0 and DBA1_B0 to enable one or both data bus amplifiers 66a and 66b. Control circuit 34 enables one of the data bus amplifiers 66a and 66b to provide a data burst of one and both of the data bus amplifiers 66a and 66b to provide a data burst of two. If data bus amplifier 66a is enabled, bank zero differential signals LIO1_B0 and LIO1#_B0 are compared to obtain a result that is provided on data bus line 72a as read/write data line signal RWDL0 at 72a. If data bus amplifier 66b is enabled, bank zero differential signals LIO0_B0 and LIO0#_B0 are compared to obtain a result that is provided on data bus line 72b as read/write data line signal RWDL1 at 72b.

To read data from memory bank one B1, control circuit 34 provides deactivated bank zero, data bus enable signals DBA0_B0 and DBA1_B0, which tri-state data bus amplifiers 66a and 66b. Control circuit 34 can provide a low or high logic signal in gating signal GATE_B0 at 100.

If gating signal GATE_B1 at 148 is a low logic level, pass gates 140a and 140b conduct to pass bank one, local I/O signals LIO0_B1 and LIO0#_B1 to the inputs of data bus amplifier 142a. Also, pass gates 140g and 140h conduct to pass bank one, local I/O signals LIO1_B1 and LIO1#_B1 to the inputs of data bus amplifier 142b. Pass gates 140c, 140d, 140e and 140f do not conduct, i.e., are high impedance.

Control circuit 34 provides bank one, data bus enable signals DBA0_B1 and DBA1_B1 to enable one or both data bus amplifiers 142a and 142b. Control circuit 34 enables one of the data bus amplifiers 142a and 142b to provide a data burst of one and both of the data bus amplifiers 142a and 142b to provide a data burst of two. If data bus amplifier 142a is enabled, bank one differential signals LIO0_B1 and LIO0#_B1 are compared to obtain a result that is provided on data bus line 72a as read/write data line signal RWDL0 at 72a. If data bus amplifier 142b is enabled, bank one differential signals LIO1_B1 and LIO1#_B1 are compared to obtain a result that is provided on data bus line 72b as read/write data line signal RWDL1 at 72b.

If gating signal GATE_B1 at 148 is a high logic level, pass gates 140c and 140d conduct to pass bank one, local I/O signals LIO1_B1 and LIO1#_B1 to the inputs of data bus amplifier 142a. Also, pass gates 140e and 140f conduct to pass bank one, local I/O signals LIO0_B1 and LIO0#_B1 to the inputs of data bus amplifier 142b. Pass gates 140a, 140b, 140g and 140h do not conduct, i.e., are high impedance.

Control circuit 34 provides bank one, data bus enable signals DBA0_B1 and DBA1_B1 to enable one or both data bus amplifiers 142a and 142b. Control circuit 34 enables one of the data bus amplifiers 142a and 142b to provide a data burst of one and both of the data bus amplifiers 142a and 142b to provide a data burst of two. If data bus amplifier 142a is enabled, bank one differential signals LIO1_B1 and LIO1#_B1 are compared to obtain a result that is provided on data bus line 72a as read/write data line signal RWDL0 at 72a. If data bus amplifier 142b is enabled, bank one differential signals LIO0_B1 and LIO0#_B1 are compared to obtain a result that is provided on data bus line 72b as read/write data line signal RWDL1 at 72b.

Figure 5:
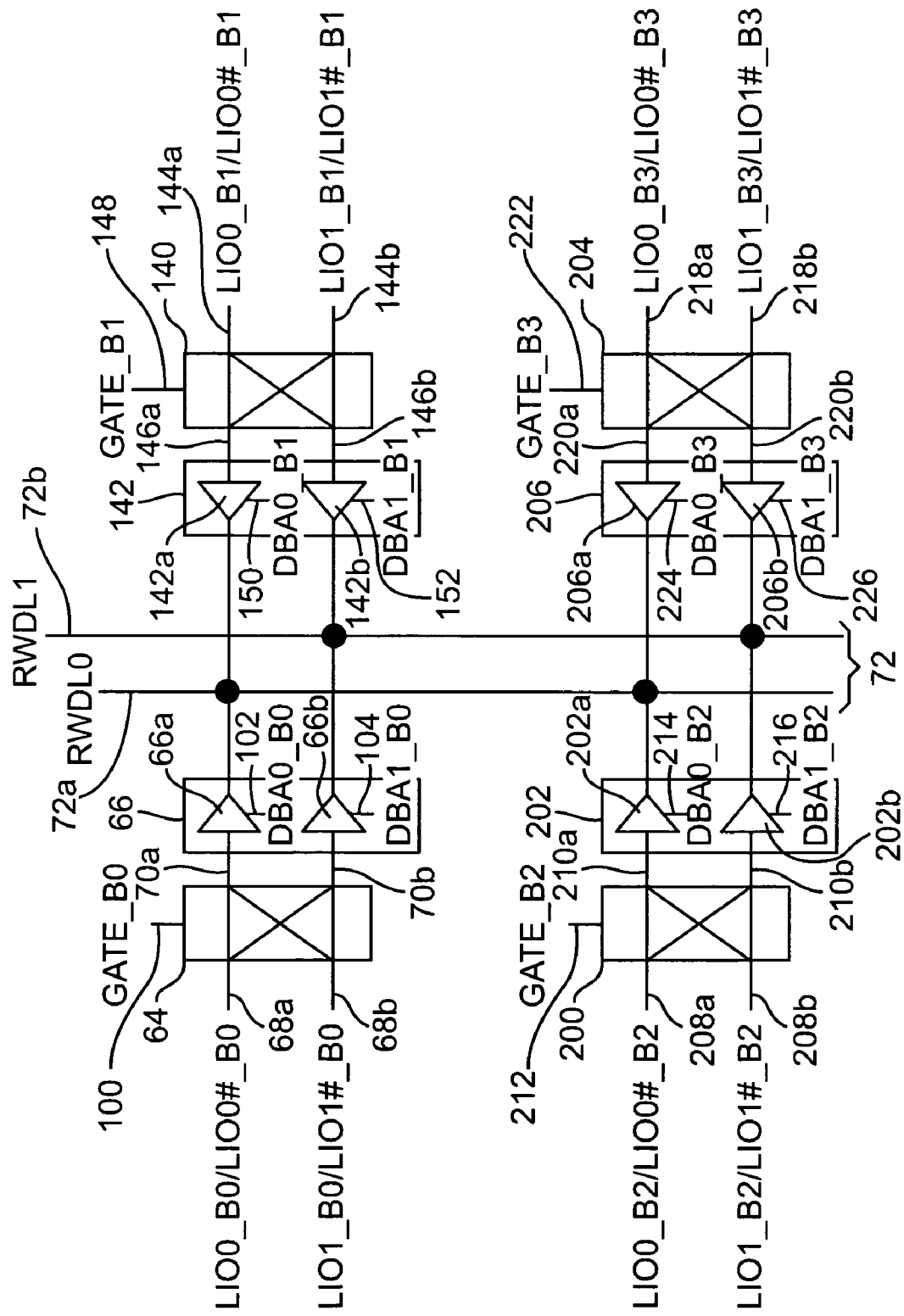
FIG. 5 is a diagram illustrating one embodiment of switching circuits and data bus amplifiers for accessing four memory banks.

FIG. 5 is a diagram illustrating one embodiment of switching circuits and data bus amplifiers for accessing four memory banks in RAM 20. Switching circuits 64, 140, 200, and 204 and data bus amplifiers 66, 142, 202, and 206 are coupled to memory bank zero B0, memory bank one B1, memory bank two B2, and memory bank three B3 in RAM 20. Data signals are provided from each of the memory banks B0, B1, B2, and B3 via data bus lines 72. In other embodiments, RAM 20 includes any suitable number of switching circuits, data bus amplifiers, and memory banks.

Switching circuit 64 is electrically coupled to secondary sense amplifiers 54 (shown in FIG. 2) via differential pairs of local I/O lines 68a and 68b and to data bus amplifiers 66 via differential pairs of switching I/O lines 70a and 70b. In addition, switching circuit 64 is electrically coupled to control circuit 34 (shown in FIG. 1) via gating signal path 100.

Data bus amplifiers 66 includes data bus amplifier 66a and data bus amplifier 66b. Data bus amplifier 66a is electrically coupled to switching circuit 64 via switching I/O line 70a and to I/O circuit 58 (shown in FIG. 2) via data I/O line 72a. Also, data bus amplifier 66a is electrically coupled to control circuit 34 via data bus amplifier enable line 102. Data bus amplifier 66b is electrically coupled to switching circuit 64 via switching I/O line 70b and to I/O circuit 58 (shown in FIG. 2) via data I/O line 72b. Also, data bus amplifier 66b is electrically coupled to control circuit 34 via data bus amplifier enable line 104.

Switching circuit 64 is configured to switch each of the two differential data signals LIO0_B0/LIO0#_B0 at 68a and LIO1_B0/LIO1#_B0 at 68b between each of the data bus amplifiers 66a and 66b. Data bus amplifier 66a is configured to output data to data I/O line 72a and data bus amplifier 66b is configured to output data to data I/O line 72b. Data bus amplifiers 66a and 66b output data signals to provide a data burst of two data bits or a data burst of one data bit at a DQ pad. In other embodiments, switching circuit 64 can be configured to switch any suitable number of data signals, such as four, eight, or sixteen data signals and data bus amplifiers 66 can be configured to output any suitable number of data signals, such as four, eight, or sixteen data signals.

Data bus amplifier 66a receives bank zero, data bus amplifier enable signal DBA0_B0 at 102 and data bus amplifier 66b receives bank zero, data bus amplifier enable signal DBA1_B0 at 104. Data bus amplifier 66a is enabled via an active data bus amplifier enable signal DBA0_B0 at 102 and disabled to a tri-state via an inactive data bus amplifier enable signal DBA0_B0 at 102. Data bus amplifier 66b is enabled via an active data bus amplifier enable signal DBA1_B0 at 104 and disabled to a tri-state via an inactive data bus amplifier enable signal DBA1_B0 at 104.

Switching circuit 140 is electrically coupled to secondary sense amplifiers (not shown) via differential pairs of local I/O lines 144a and 144b and to data bus amplifiers 142 via differential pairs of switching I/O lines 146a and 146b. In addition, switching circuit 140 is electrically coupled to control circuit 34 via gating signal path 148.

Data bus amplifiers 142 includes data bus amplifier 142a and data bus amplifier 142b. Data bus amplifier 142a is electrically coupled to switching circuit 140 via switching I/O line 146a and to I/O circuit 58 via data I/O line 72a. Also, data bus amplifier 142a is electrically coupled to control circuit 34 via data bus amplifier enable line 150. Data bus amplifier 142b is electrically coupled to switching circuit 140 via switching I/O line 146b and to I/O circuit 58 via data I/O line 72b. Also, data bus amplifier 142b is electrically coupled to control circuit 34 via data bus amplifier enable line 152.

Switching circuit 140 is configured to switch each of the two differential data signals LIO0_B1/LIO0#_B1 at 144a and LIO1_B1/LIO1#_B1 at 144b between each of the data bus amplifiers 142a and 142b. Data bus amplifier 142a is configured to output data to data I/O line 72a and data bus amplifier 142b is configured to output data to data I/O line 72b. Data bus amplifiers 142a and 142b output data signals to provide a data burst of two data bits or a data burst of one data bit at a DQ pad. In other embodiments, switching circuit 140 can be configured to switch any suitable number of data signals, such as four, eight, or sixteen data signals and data bus amplifiers 142 can be configured to output any suitable number of data signals, such as four, eight, or sixteen data signals.

Data bus amplifier 142a receives bank one, data bus amplifier enable signal DBA0_B1 at 150 and data bus amplifier 142b receives bank one, data bus amplifier enable signal DBA1_B1 at 152. Data bus amplifier 142a is enabled via an active data bus amplifier enable signal DBA0_B1 at 150 and disabled to a tri-state via an inactive data bus amplifier enable signal DBA0_B1 at 150. Data bus amplifier 142b is enabled via an active data bus amplifier enable signal DBA1_B1 at 152 and disabled to a tri-state via an inactive data bus amplifier enable signal DBA1_B1 at 152.

Switching circuit 200 is electrically coupled to secondary sense amplifiers (not shown) via differential pairs of local I/O lines 208a and 208b and to data bus amplifiers 202 via differential pairs of switching I/O lines 210a and 210b. In addition, switching circuit 200 is electrically coupled to control circuit 34 via gating signal path 212.

Data bus amplifiers 202 includes data bus amplifier 202a and data bus amplifier 202b. Data bus amplifier 202a is electrically coupled to switching circuit 200 via switching I/O line 210a and to I/O circuit 58 via data I/O line 72a. Also, data bus amplifier 202a is electrically coupled to control circuit 34 via data bus amplifier enable line 214. Data bus amplifier 202b is electrically coupled to switching circuit 200 via switching I/O line 210b and to I/O circuit 58 via data I/O line 72b. Also, data bus amplifier 202b is electrically coupled to control circuit 34 via data bus amplifier enable line 216.

Switching circuit 200 is configured to switch each of the two differential data signals LIO0_B2/LIO0#_B2 at 208a and LIO1_B2/LIO1#_B2 at 208b between each of the data bus amplifiers 202a and 202b. Data bus amplifier 202a is configured to output data to data I/O line 72a and data bus amplifier 202b is configured to output data to data I/O line 72b. Data bus amplifiers 202a and 202b output data signals to provide a data burst of two data bits or a data burst of one data bit at a DQ pad. In other embodiments, switching circuit 200 can be configured to switch any suitable number of data signals, such as four, eight, or sixteen data signals and data bus amplifiers 202 can be configured to output any suitable number of data signals, such as four, eight, or sixteen data signals.

Data bus amplifier 202a receives bank two, data bus amplifier enable signal DBA0_B2 at 214 and data bus amplifier 202b receives bank two, data bus amplifier enable signal DBA1_B2 at 216. Data bus amplifier 202a is enabled via an active data bus amplifier enable signal DBA0_B2 at 214 and disabled to a tri-state via an inactive data bus amplifier enable signal DBA0_B2 at 214. Data bus amplifier 202b is enabled via an active data bus amplifier enable signal DBA1_B2 at 216 and disabled to a tri-state via an inactive data bus amplifier enable signal DBA1_B2 at 216.

Switching circuit 204 is electrically coupled to secondary sense amplifiers (not shown) via differential pairs of local I/O lines 218a and 218b and to data bus amplifiers 206 via differential pairs of switching I/O lines 220a and 220b. In addition, switching circuit 204 is electrically coupled to control circuit 34 via gating signal path 222.

Data bus amplifiers 206 includes data bus amplifier 206a and data bus amplifier 206b. Data bus amplifier 206a is electrically coupled to switching circuit 204 via switching I/O line 220a and to I/O circuit 58 via data I/O line 72a. Also, data bus amplifier 206a is electrically coupled to control circuit 34 via data bus amplifier enable line 224. Data bus amplifier 206b is electrically coupled to switching circuit 204 via switching I/O line 220b and to I/O circuit 58 via data I/O line 72b. Also, data bus amplifier 206b is electrically coupled to control circuit 34 via data bus amplifier enable line 226.

Switching circuit 204 is configured to switch each of the two differential data signals LIO0_B3/LIO0#_B3 at 218a and LIO1_B3/LIO1#_B3 at 218b between each of the data bus amplifiers 206a and 206b. Data bus amplifier 206a is configured to output data to data I/O line 72a and data bus amplifier 206b is configured to output data to data I/O line 72b. Data bus amplifiers 206a and 206b output data signals to provide a data burst of two data bits or a data burst of one data bit at a DQ pad. In other embodiments, switching circuit 204 can be configured to switch any suitable number of data signals, such as four, eight, or sixteen data signals and data bus amplifiers 206 can be configured to output any suitable number of data signals, such as four, eight, or sixteen data signals.

Data bus amplifier 206a receives bank three, data bus amplifier enable signal DBA0_B3 at 224 and data bus amplifier 206b receives bank three, data bus amplifier enable signal DBA1_B3 at 226. Data bus amplifier 206a is enabled via an active data bus amplifier enable signal DBA0_B3 at 224 and disabled to a tri-state via an inactive data bus amplifier enable signal DBA0_B3 at 224. Data bus amplifier 206b is enabled via an active data bus amplifier enable signal DBA1_B3 at 226 and disabled to a tri-state via an inactive data bus amplifier enable signal DBA1_B3 at 226.

Switching circuits 200 and 204 are similar to switching circuits 64 and 140, which were described in reference to FIG. 4. Also, data bus amplifiers 202 and 206 are similar to data bus amplifiers 66 and 142, which were described in reference to FIG. 4.

To read data from one of the memory banks B0, B1, B2, and B3, a read address is provided to address register 36 (shown in FIG. 1) and control circuit 34. Control circuit 34 controls switching circuits 64, 140, 200, and 204 and data bus amplifiers 66, 142, 202, and 206 to provide data from the memory banks B0, B1, B2, and B3 on data bus lines 72. In one embodiment, data from only one of the memory banks B0, B1, B2, and B3 at a time is provided to the data bus lines 72.

To read data from a selected one of the memory banks B0, B1, B2, and B3, control circuit 34 provides deactivated data bus enable signals DBA0_Bx and DBA1_Bx to data bus amplifiers 66, 142, 202, and 206 that are coupled to non-selected memory banks B0, B1, B2, and B3. This tri-states the data bus amplifiers coupled to non-selected memory banks B0, B1, B2, and B3. Control circuit 34 can provide low or high logic signals in the gating signals GATE_Bx of switching circuits 64, 140, 200, and 204 coupled to non-selected memory banks B0, B1, B2, and B3.

The gating signal GATE_Bx provided to the switching circuit 64, 140, 200, and 204 coupled to the selected one of the memory banks B0, B1, B2, and B3 is provided at a low logic level or a high logic level to output one or more addressed data bits. Control circuit 34 provides data bus enable signals DBA0_Bx and DBA1_Bx to enable one or both data bus amplifiers coupled to the selected one of the memory banks B0, B1, B2, and B3. Control circuit 34 enables one of the data bus amplifiers to provide a data burst of one and both of the data bus amplifiers to provide a data burst of two. One data bus amplifier provides a result on data bus line 72a as read/write data line signal RWDL0 at 72a and the other data bus amplifier provides the result on data bus line 72b as read/write data line signal RWDL1 at 72b.

Figure 6:
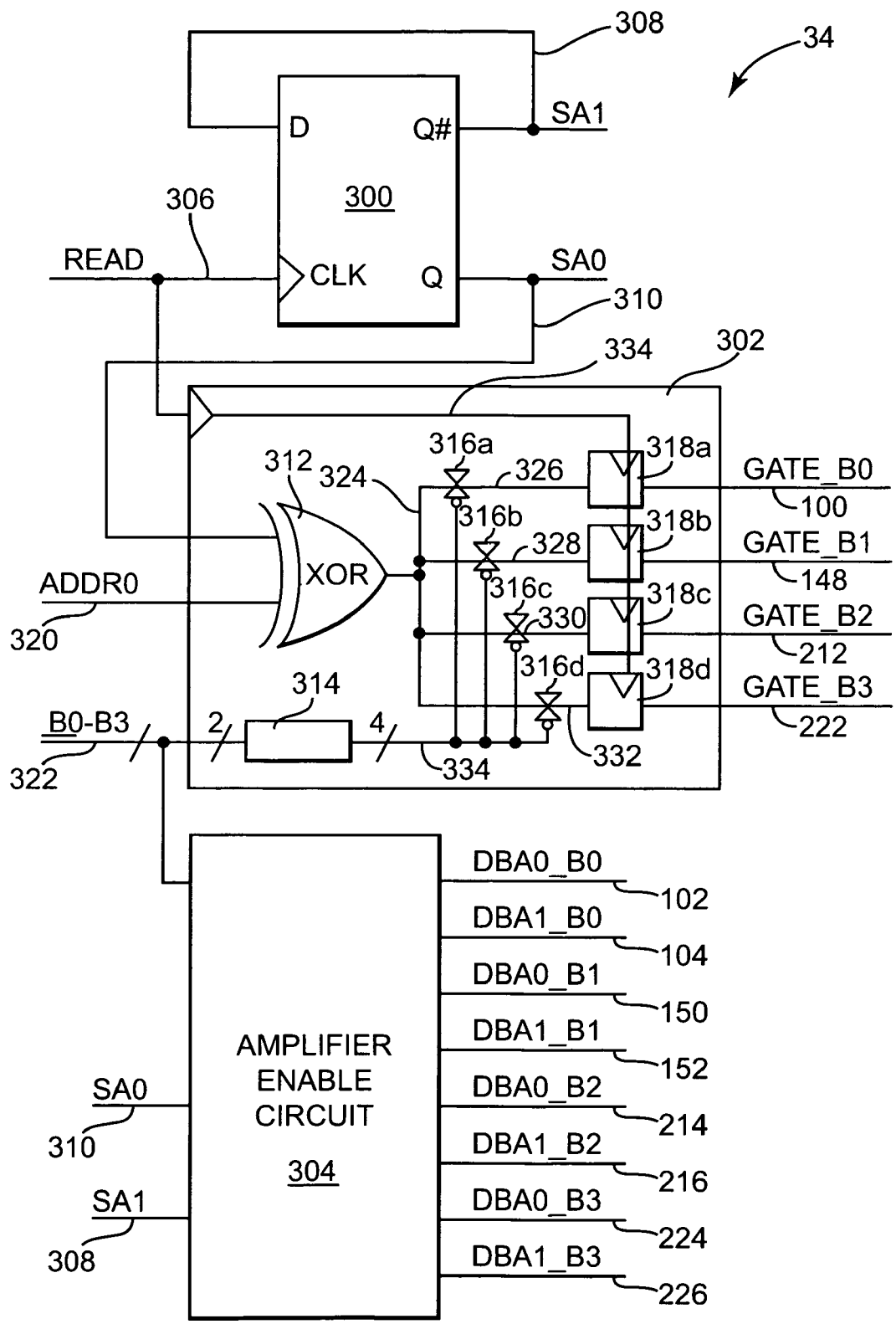
FIG. 6 is a diagram illustrating one embodiment of a control circuit.

FIG. 6 is a diagram illustrating one embodiment of control circuit 34 configured to control data burst read operations from four memory banks B0, B1, B2, and B3 in RAM 20. Control circuit 34 includes a D flip-flop 300, a gating circuit 302, and an amplifier enable circuit 304. Control circuit 34 controls gating data signals from the four memory banks B0, B1, B2, and B3 onto two data bus lines 72 (shown in FIG. 5), including switching data signals between data bus amplifiers and enabling one or both of the data bus amplifiers to provide data bursts of one or two data bits. In other embodiments, control circuit 34 can be configured to control gating data signals from any suitable number of memory banks onto any suitable number of data bus lines. In other embodiments, control circuit 34 controls switching data signals between data bus amplifiers and enabling data bus amplifiers to provide data bursts of any suitable data burst length.

To provide one data bit at a time from memory banks B0, B1, B2, and B3, control circuit 34 controls switching and data bus amplifiers to provide a first data signal from one memory bank to the first data bus line 72 and a second data signal from another memory bank to the second data bus line 72. The second data signal can be put onto the second data bus line 72 while the first data bus line 72 is busy with the first data signal. Thus, the column to column delay time Tccd in successive reads from one memory bank and another memory bank is reduced.

The D flip-flop 300 receives a read signal READ at 306 that includes a pulse in response to a read command. The pulse in read signal READ at 306 is provided to the clock input CLK of D flip-flop 300. The inverted output Q# is electrically coupled to the D input via inverted output path 308 and the non-inverted output Q is electrically coupled to gating circuit 302 via output path 310. The D flip-flop 300 toggles output signal SA0 at 310 and inverted output signal SA1 at 308 between logic states in response to each pulse in read signal READ at 306.

Gating circuit 302 includes an exclusive- or (XOR) circuit 312, a decoder 314, pass gates 316a-316d, and gating signal flip-flops 318a-318d. Gating circuit 302 receives read signal READ at 306, output signal SA0 at 310, and an address signal ADDR0 at 320. Also, gating circuit 302 receives a memory bank address B0-B3 at 322. Gating circuit 302 provides gating signals GATE_B0 at 100, GATE_B1 at 148, GATE_B2 at 212, and GATE_B3 at 222.

The XOR circuit 312 receives output signal SA0 at 310 and address signal ADDR0 at 320 and the output of XOR circuit 312 is electrically coupled to each of the pass gates 316a-316d via XOR output path 324. The XOR circuit 312 provides the XOR result to each of the pass gates 316a-316d.

Pass gate 316a is electrically coupled to the data input of gating signal flip-flop 318a via pass gate output path 326, pass gate 316b is electrically coupled to the data input of gating signal flip-flop 318b via pass gate output path 328, pass gate 316c is electrically coupled to the data input of gating signal flip-flop 318c via pass gate output path 330, and pass gate 316d is electrically coupled to the data input of gating signal flip-flop 318d via pass gate output path 332. Pass gate 316a passes the XOR result to gating signal flip-flop 318a to provide gating signal GATE_B0 at 100, pass gate 316b passes the XOR result to gating signal flip-flop 318b to provide gating signal GATE_B1 at 148, pass gate 316c passes the XOR result to gating signal flip-flop 318c to provide gating signal GATE_B2 at 212, and pass gate 316d passes the XOR result to gating signal flip-flop 318d to provide gating signal GATE_B3 at 222. The clock input of each of the gating signal flip-flops 318a-318d is electrically coupled to read signal path 334 and receives read signal READ at 306.

Decoder 314 is electrically coupled to the control input of each of the pass gates 316a-316d via pass gate bus 334. Decoder 314 receives memory bank address B0-B3 at 322 and provides decoded signals to activate one of the pass gates 316a-316d. If the memory bank address B0-B3 at 322 addresses memory bank zero B0, decoder 314 provides signals to activate pass gate 316a and deactivate pass gates 316b-316d. If the memory bank address B0-B3 at 322 addresses memory bank one B1, decoder 314 provides signals to activate pass gate 316b and deactivate pass gates 316a, 316c, and 316d. If the memory bank address B0-B3 at 322 addresses memory bank two B2, decoder 314 provides signals to activate pass gate 316c and deactivate pass gates 316a, 316b, and 316d. If the memory bank address B0-B3 at 322 addresses memory bank three B3, decoder 314 provides signals to activate pass gate 316d and deactivate pass gates 316a-316c.

The XOR circuit 312 receives output signal SA0 at 310 and address signal ADDR0 at 320 and provides the XOR result to pass gates 316a-316d. If a data burst of one is output and address signal ADDR0 at 320 addresses the same data bus line 72 in successive read operations, output signal SA0 at 310 toggles to toggle the XOR result and provide the second data signal on the other data bus line. Thus, data signals are provided to data bus lines 72 that are not busy with previous data signals.

Decoder 314 receives and decodes memory bank address B0-B3 at 322 and provides an active gate signal to the pass gate 316a-316d that corresponds to the addressed memory bank. The activated pass gate 316a-316d passes the XOR result to the gating signal flip-flop 318a-318d coupled to the activated pass gate 316a-316d and the gating signal flip-flop 318a-318d receives a pulse in read signal READ at 306 to latch in the XOR result. Thus, a low logic level or a high logic level is latched into the gating signal flip-flop 318a-318d via the activated pass gate 316a-316d and read signal READ at 306. The latched signal is provided as one of the gating signals GATE_B0 at 100, GATE_B1 at 148, GATE_B2 at 212, or GATE_B3 at 222 to read one or more data signals from the addressed memory bank.

Amplifier enable circuit 304 receives memory bank address B0-B3 at 322, output signal SA0 at 310, and inverted output signal SA1 at 308. Amplifier enable circuit 304 provides data bus amplifier enable signals DBA0_B0 at 102 and DBA1_B0 at 104 to read data from memory bank zero B0, data bus amplifier enable signals DBA0_B1 at 150 and DBA1_B1 at 152 to read data from memory bank one B1, data bus amplifier enable signals DBA0_B2 at 214 and DBA1_B2 at 216 to read data from memory bank two B2, and data bus amplifier enable signals DBA0_B3 at 224 and DBA1_B3 at 226 to read data from memory bank three B3.

Amplifier enable circuit 304 can activate both data bus amplifier enable signals DBA0_Bx and DBA1_Bx to enable both data bus amplifiers and read two data signals from an addressed memory bank. Also, amplifier enable circuit 304 can activate one of the data bus amplifier enable signals DBA0_Bx and DBA1_Bx to enable one of the data bus amplifiers and output one data signal from an addressed memory bank.

To read two data signals, amplifier enable circuit 304 activates both data bus amplifier enable signals DBA0_Bx and DBA1_Bx for the addressed memory bank in response to a rising edge in output signal SA0 at 310, which latches in the addressed memory bank address and activates both data bus amplifiers. Also, amplifier enable circuit 304 activates both data bus amplifier enable signals DBA0_Bx and DBA1_Bx for the addressed memory bank in response to a rising edge in inverted output signal SA1 at 308, which latches in the memory bank address and activates both data bus amplifiers.

To read one data signal, amplifier enable circuit 304 activates the data bus amplifier enable signal DBA0_Bx for the addressed memory bank in response to a rising edge in output signal SA0 at 310, which latches in the addressed memory bank address and activates the zero data bus amplifier. Also, amplifier enable circuit 304 activates the data bus amplifier enable signals DBA1_Bx for the addressed memory bank in response to a rising edge in inverted output signal SA1 at 308, which latches in the memory bank address and activates the one data bus amplifier.

In operation, the XOR circuit 312 receives output signal SA0 at 310 and address signal ADDR0 at 320 and provides the XOR result to pass gates 316a-316d. Decoder 314 receives and decodes the memory bank address B0-B3 at 322 and provides an active gate signal to the pass gate 316a-316d for the addressed memory bank. The activated pass gate 316a-316d passes the XOR result to the gating signal flip-flop 318a-318d coupled to the activated pass gate 316a-316d.

Read signal READ at 306 includes a pulse in response to a read command, which toggles output signal SA0 at 310 and inverted output signal SA1 at 308. Gating signal flip-flops 318a-318d receive the pulse in read signal READ at 306 and one of the gating signal flip-flops latches in the XOR result. A low logic level or a high logic level is latched into the gating signal flip-flop 318a-318d as one of the gating signals GATE_B0 at 100, GATE_B1 at 148, GATE_B2 at 212, or GATE_B3 at 222 to read one or more data signals from the addressed memory bank.

Amplifier enable circuit 304 receives the memory bank address B0-B3 at 322, output signal SA0 at 310, and inverted output signal SA1 at 308 and activates data bus amplifier enable signals DBA0_Bx and DBA1_Bx for a predetermined time to output data from memory banks B0-B3. To output a data burst of two data bits from the addressed memory bank, amplifier enable circuit 304 activates both data bus amplifier enable signals DBA0_Bx and DBA1_Bx for the addressed memory bank in response to a rising edge in output signal SA0 at 310 and amplifier enable circuit 304 activates both data bus amplifier enable signals DBA0_Bx and DBA1_Bx for the addressed memory bank in response to a rising edge in inverted output signal SA1 at 308. To output a data burst of one data bit from the addressed memory bank, amplifier enable circuit 304 activates the zero data bus amplifier enable signal DBA0_Bx for the addressed memory bank in response to a rising edge in output signal SA0 at 310, which activates the data bus amplifier that provides an output to data bus line 72a, and amplifier enable circuit 304 activates the one data bus amplifier enable signal DBA1_Bx for the addressed memory bank in response to a rising edge in inverted output signal SA1 at 308, which activates the data bus amplifier that provides an output to data bus line 72b.

Figure 7:
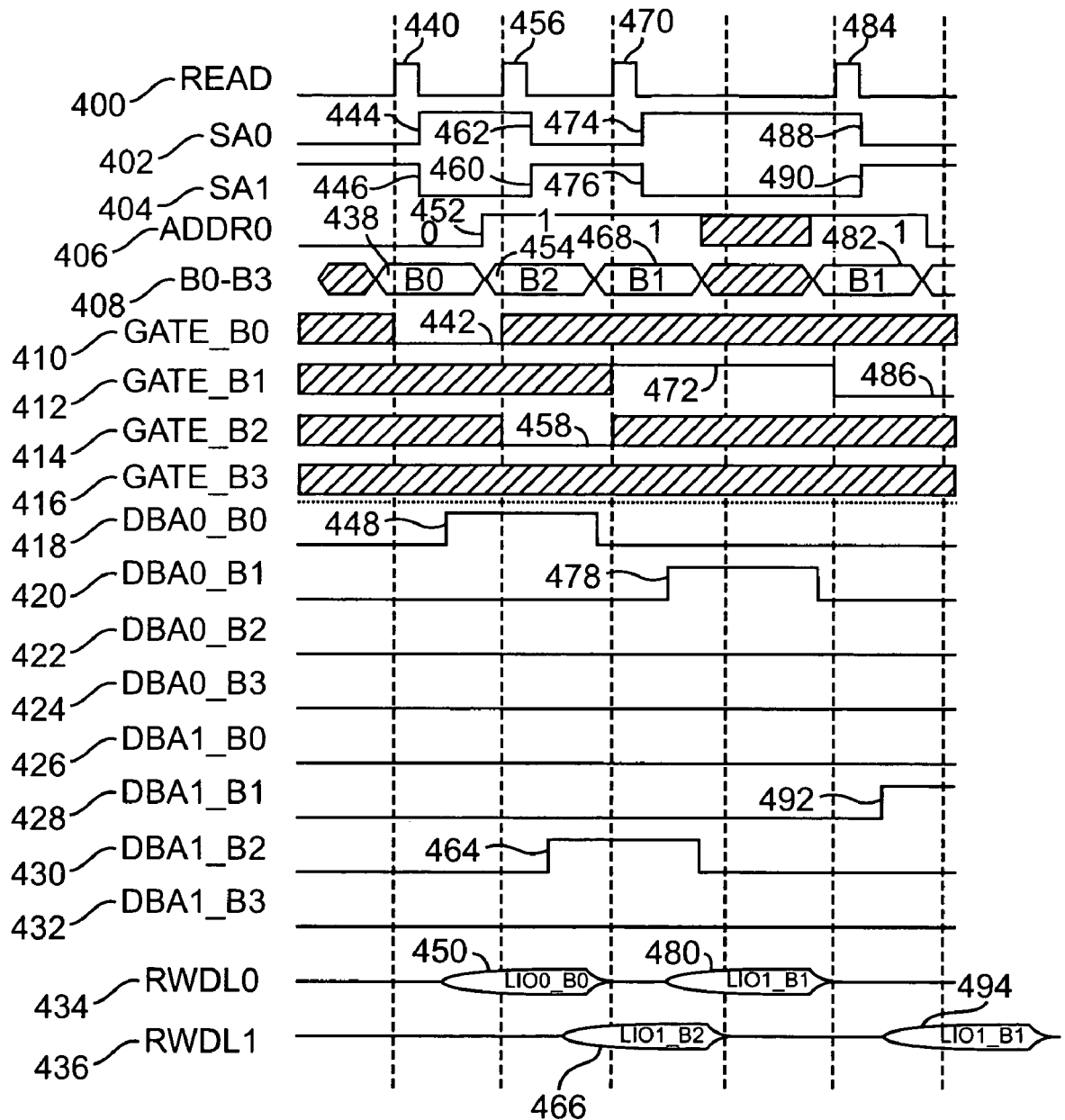
FIG. 7 is a timing diagram illustrating the operation of one embodiment of a RAM and a control circuit.

FIG. 7 is a timing diagram illustrating the operation of one embodiment of RAM 20 and control circuit 34. Read signal READ at 400 is received by D flip-flop 300 (shown in FIG. 6) and gating circuit 302. The D flip-flop 300 receives pulses in read signal READ at 400 and toggles to provide output signal SA0 at 402 and inverted output signal SA1 at 404. Gating circuit 302 receives output signal SA0 at 402, data bus line address ADDR0 at 406, and memory bank addresses B0-B3 at 408. Also, amplifier enable circuit 304 receives output signal SA0 at 402, inverted output signal SA1 at 404, and memory bank addresses B0-B3 at 408.

Gating circuit 302 provides gating signals GATE_B0 at 410, GATE_B1 at 412, GATE_B2 at 414, and GATE_B3 at 416. Amplifier enable circuit 304 provides amplifier enable signals DBA0_B0 at 418, DBA0_B1 at 420, DBA0_B2 at 422, DBA0_B3 at 424, DBA1_B0 at 426, DBA1_B1 at 428, DBA1_B2 at 430, and DBA1_B3 at 432. Data bus amplifiers 66, 142, 202, and 206 (shown in FIG. 5) provide data bus signals RWDL0 at 434 and RWDL1 at 436.

The XOR circuit 312 receives a low logic level in output signal SA0 at 402 and a low logic level in address signal ADDR0 at 406 that results in a low logic level XOR result. The XOR result is received by pass gates 316a-316d and decoder 314 receives and decodes memory bank address zero B0 at 438 in memory bank address B0-B3 at 408. Decoder 314 provides an active gate signal to pass gate 316a and the activated pass gate 316a passes the low logic level XOR result to the input of gating signal flip-flop 318a.

Read signal READ at 400 includes a pulse at 440 in response to a read command. Gating signal flip-flops 318a-318d receive the pulse at 440 in read signal READ at 400 and gating signal flip-flop 318a latches in the low logic level XOR result. Gating signal flip-flop 318a provides the low logic level at 442 in gating signal GATE_B0 at 410. Also, the pulse at 440 toggles output signal SA0 at 402 from a low logic level to a high logic level at 444 and inverted output signal SA1 at 404 from a high logic level to a low logic level at 446.

Amplifier enable circuit 304 receives memory bank address zero B0 at 438 in memory bank address B0-B3 at 408. The rising edge at 444 in output signal SA0 at 402 activates data bus amplifier enable signal DBA0_B0 at 418 to provide a high logic level at 448 for a predetermined time to data bus amplifier 66*a*. Gating signal GATE_B0 at 410 is at a low logic level at 442 to gate data signal LIO0_B0/LIO0#_B0 at 68*a* (shown in FIG. 5) to data bus amplifier 66*a*. The enabled data bus amplifier 66*a* outputs data signal LIO0_B0/LIO0#_B0 at 450 in data bus signal RWDL0 at 434.

In response to the next read command, address signal ADDR0 at 406 transitions from a low logic level to a high logic level at 452 and memory bank address two B2 at 454 is provided in memory bank addresses B0-B3 at 408. The XOR circuit 312 receives a high logic level in output signal SA0 at 402 and a high logic level in address signal ADDR0 at 406 that results in a low logic level XOR result. The XOR result is received by pass gates 316*a*-316*d* and decoder 314 receives and decodes memory bank address two B2 at 454 in memory bank address B0-B3 at 408. Decoder 314 provides an active gate signal to pass gate 316*c* and the activated pass gate 316*c* passes the low logic level XOR result to the input of gating signal flip-flop 318*c*.

Read signal READ at 400 includes a pulse at 456 in response to the read command and gating signal flip-flops 318*a*-318*d* receive the pulse at 456 in read signal READ at 400. Gating signal flip-flop 318*c* latches in the low logic level XOR result and provides the low logic level at 458 in gating signal GATE_B2 at 414. Also, the pulse at 456 toggles output signal SA1 at 404 from a low logic level to a high logic level at 460 and inverted output signal SA0 at 402 from a high logic level to a low logic level at 462.

Amplifier enable circuit 304 receives memory bank address two B2 at 454 in memory bank address B0-B3 at 408. The rising edge at 460 in inverted output signal SA1 at 404 activates data bus amplifier enable signal DBA1_B2 at 430 to provide a high logic level at 464 for a predetermined time to data bus amplifier 202*b*. Gating signal GATE_B2 at 414 is at a low logic level at 458 to gate data signal LIO1_B2/LIO1#_B2 at 208*b* (shown in FIG. 5) to data bus amplifier 202*b*. The enabled data bus amplifier 202*b* outputs data signal LIO1_B2/LIO1#_B2 at 466 in data bus signal RWDL1 at 436.

In response to a third read command, address signal ADDR0 at 406 stays at the high logic level and memory bank address one B1 at 468 is provided in memory bank addresses B0-B3 at 408. The XOR circuit 312 receives a low logic level in output signal SA0 at 402 and a high logic level in address signal ADDR0 at 406 that results in a high logic level XOR result. The XOR result is received by pass gates 316*a*-316*d* and decoder 314 receives and decodes memory bank address one B1 at 468 in memory bank address B0-B3 at 408. Decoder 314 provides an active gate signal to pass gate 316*b* and the activated pass gate 316*b* passes the high logic level XOR result to the input of gating signal flip-flop 318*b*.

Read signal READ at 400 includes a pulse at 470 in response to the read command and gating signal flip-flops 318*a*-318*d* receive the pulse at 470 in read signal READ at 400. Gating signal flip-flop 318*b* latches in the high logic level XOR result and provides the high logic level at 472 in gating signal GATE_B1 at 412. Also, the pulse at 470 toggles output signal SA0 at 402 from a low logic level to a high logic level at 474 and inverted output signal SA1 at 404 from a high logic level to a low logic level at 476.

Amplifier enable circuit 304 receives memory bank address one B1 at 468 in memory bank address B0-B3 at 408. The rising edge at 474 in output signal SA0 at 402 activates data bus amplifier enable signal DBA0_B1 at 420 to provide a high logic level at 478 for a predetermined time to data bus amplifier 142*a*. Gating signal GATE_B1 at 412 is at a high logic level at 472 to gate data signal LIO1_B1/LIO1#_B1 at 144*b* (shown in FIG. 5) to data bus amplifier 142*a*. The enabled data bus amplifier 144*a* outputs data signal LIO1_B1/LIO1#_B1 at 480 in data bus signal RWDL0 at 434.

Next, another read command is issued to read data from memory bank one B1 in consecutive read operations from the same memory bank. Each of the other read commands have been to read data from different memory banks in consecutive read operations. After a delay to access the same memory bank consecutively and in response to the fourth read command, address signal ADDR0 at 406 is at a high logic level and memory bank address one B1 at 468 is provided in memory bank addresses B0-B3 at 408.

The XOR circuit 312 receives a high logic level in output signal SA0 at 402 and a high logic level in address signal ADDR0 at 406 that results in a low logic level XOR result. The XOR result is received by pass gates 316*a*-316*d* and decoder 314 receives and decodes memory bank address one B1 at 482 in memory bank address B0-B3 at 408. Decoder 314 provides an active gate signal to pass gate 316*b* and the activated pass gate 316*b* passes the low logic level XOR result to the input of gating signal flip-flop 318*b*.

Read signal READ at 400 includes a pulse at 484 in response to the read command and gating signal flip-flops 318*a*-318*d* receive the pulse at 484 in read signal READ at 400. Gating signal flip-flop 318*b* latches in the low logic level XOR result and provides the low logic level at 486 in gating signal GATE_B1 at 412. Also, the pulse at 484 toggles inverted output signal SA1 at 404 from a low logic level to a high logic level at 490 and output signal SA0 at 402 from a high logic level to a low logic level at 488.

Amplifier enable circuit 304 receives memory bank address one B1 at 482 in memory bank address B0-B3 at 408. The rising edge at 490 in inverted output signal SA1 at 404 activates data bus amplifier enable signal DBA1_B1 at 428 to provide a high logic level at 492 for a predetermined time to data bus amplifier 142*b*. Gating signal GATE_B1 at 412 is at a low logic level at 486 to gate data signal LIO1_B1/LIO1#_B1 at 144*b* (shown in FIG. 5) to data bus amplifier 142*b*. The enabled data bus amplifier 144*b* outputs data signal LIO1_B1/LIO1#_B1 at 494 in data bus signal RWDL1 at 436.

RAM 20 is configured to receive read commands and read data from different memory banks B0-B3 without a delay time between consecutive read operations. RAM 20 outputs one of two prefetched data signals, i.e., a subset of N prefetched data signals, on alternating data bus lines 72 to avoid data signal collisions on busy data signal lines 72. RAM 20 can output the subset of N prefetched data signals faster than if RAM 20 waited for all data bus lines 72 to be flushed before outputting the data signals. In other embodiments, RAM 20 outputs any suitable subset of any suitable number of prefetched data signals.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A random access memory, comprising:
   a first amplifier;
   a second amplifier;

a first data path that receives first data via first memory cells;

a second data path that receives second data via second memory cells; and a first circuit configured to receive the first data via the first data path and the second data via the second data path and to selectively provide the first data to the first amplifier and the second amplifier and the second data to the first amplifier and the second amplifier.

2. The random access memory of claim 1, wherein the first circuit is configured to provide the first data to the first amplifier and the second data to the second amplifier in one state of the first circuit and the second data to the first amplifier and the first data to the second amplifier in another state of the first circuit.

3. The random access memory of claim 1, comprising:
a control circuit configured to control the first circuit to provide the first data to one of the first amplifier and the second amplifier and the second data to the other one of the first amplifier and the second amplifier.

4. The random access memory of claim 1, comprising:
a control circuit configured to activate one of the first amplifier and the second amplifier.

5. The random access memory of claim 1, comprising:
a control circuit configured to activate one of the first amplifier and the second amplifier and control the first circuit to provide one of the first data and the second data to the activated one of the first amplifier and the second amplifier.

6. The random access memory of claim 1, wherein the first memory cells and the second memory cells are in a first memory bank.

7. The random access memory of claim 6, comprising:
a third amplifier;
a fourth amplifier;
a third data path that receives third data via third memory cells;
a fourth data path that receives fourth data via fourth memory cells; and
a second circuit configured to receive the third data via the third data path and the fourth data via the fourth data path and to selectively provide the third data to the third amplifier and the fourth amplifier and the fourth data to the third amplifier and the fourth amplifier.

8. The random access memory of claim 7, wherein the third memory cells and the fourth memory cells are in a second memory bank and outputs of the first amplifier and the third amplifier are coupled together and outputs of the second amplifier and the fourth amplifier are coupled together.

9. The random access memory of claim 8, comprising:
a control circuit configured to activate one of the first amplifier and the third amplifier and to control the first circuit and the second circuit to provide one of the first data and the third data to the activated one of the first amplifier and the third amplifier.

10. A random access memory, comprising:
a first memory bank;
first amplifiers configured to receive first data signals via the first memory bank;
a first circuit configured to receive N of the first data signals via the first amplifiers;
a control circuit configured to control the first circuit to output a subset of the N first data signals;
a second memory bank;
second amplifiers configured to receive second data signals via the second memory bank; and a second circuit configured to receive N of the second data signals via the second amplifiers, wherein the control circuit is configured to control the second circuit to output a subset of the N second data signals and the control circuit is configured to control the first circuit and the second circuit to sequentially output the subset of the N first data signals and the subset of the N second data signals.

11. The random access memory of claim 10, wherein the first circuit comprises N third amplifiers and the control circuit is configured to activate a subset of the N third amplifiers to output the subset of the N first data signals.

12. The random access memory of claim 11, wherein the first circuit comprises:
a third circuit configured to provide the subset of the N first data signals to the activated subset of the N third amplifiers.

13. A random access memory, comprising:
a first memory bank;
first amplifiers configured to receive first data signals via the first memory bank;
a first circuit configured to receive N of the first data signals via the first amplifiers;
a control circuit configured to control the first circuit to output a subset of the N first data signals, a second memory bank;
second amplifiers configured to receive second data signals via the second memory bank; and
a second circuit configured to receive N of the second data signals via the second amplifiers, wherein the control circuit is configured to control the second circuit to output a subset of the N second data signals and the first circuit comprises N third amplifiers and the second circuit comprises N fourth amplifiers and the control circuit is configured to activate a subset of the N third amplifiers to output the subset of the N first data signals and to activate a subset of the N fourth amplifiers to output the subset of the N second data signals.

14. A random access memory, comprising:
means for outputting a first signal;
means for outputting a second signal;
means for receiving first data via first memory cells;
means for receiving second data via second memory cells;
means for selectively passing the first data to the means for outputting a first signal and to the means for outputting a second signal; and
means for selectively passing the second data to the means for outputting a first signal and to the means for outputting a second signal.

15. The random access memory of claim 14, comprising:
means for controlling the means for selectively passing the first data and the means for selectively passing the second data to provide the first data to one of the means for outputting a first signal and the means for outputting a second signal and the second data to the other one of the means for outputting a first signal and the means for outputting a second signal.

16. The random access memory of claim 14, comprising:
means for activating one of the means for outputting a first signal and the means for outputting a second signal; and
means for controlling the means for selectively passing the first data and the means for selectively passing the second data to provide one of the first data and the second data to the activated one of the means for outputting a first signal and the means for outputting a second signal.

17. The random access memory of claim 14, comprising:
means for outputting a third signal;

means for outputting a fourth signal;
means for receiving third data via third memory cells;
means for receiving fourth data via fourth memory cells;
means for selectively passing the third data to the means for outputting a third signal and to the means for outputting a fourth signal; and
means for selectively passing the fourth data to the means for outputting a third signal and to the means for outputting a fourth signal.

18. A method of outputting data in a random access memory, comprising:
receiving first data via first memory cells;
receiving second data via second memory cells;
switching the first data between a first amplifier and a second amplifier; and
switching the second data between the first amplifier and the second amplifier.

19. The method of claim 18, comprising:
controlling the switching the first data to output the first data via one of the first amplifier and the second amplifier; and
controlling the switching the second data to output the second data via the other one of the first amplifier and the second amplifier.

20. The method of claim 18, comprising:
activating one of the first amplifier and the second amplifier; and
controlling the switching the first data and the switching the second data to provide one of the first data and the second data to the activated one of the first amplifier and the second amplifier.

21. The method of claim 18, comprising:
receiving third data via third memory cells;
receiving fourth data via fourth memory cells;
switching the third data between a third amplifier and a fourth amplifier; and
switching the fourth data between the third amplifier and the fourth amplifier.

* * * * *